United States Patent
Morizumi et al.

(10) Patent No.: US 10,193,294 B2
(45) Date of Patent: Jan. 29, 2019

(54) LIGHT EMITTING DEVICE

(71) Applicant: NICHIA CORPORATION, Anan-shi, Tokushima (JP)

(72) Inventors: Naoto Morizumi, Yoshinogawa (JP); Akinori Yoneda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/631,503

(22) Filed: Jun. 23, 2017

(65) Prior Publication Data

US 2017/0373455 A1  Dec. 28, 2017

(30) Foreign Application Priority Data

Jun. 27, 2016  (JP) ................. 2016-126586

(51) Int. Cl.
*H01R 33/02* (2006.01)
*H01S 3/02* (2006.01)
(Continued)

(52) U.S. Cl.
CPC ................. *H01S 3/02* (2013.01); *H01S 3/05* (2013.01); *H01S 5/005* (2013.01);
(Continued)

(58) Field of Classification Search
CPC .... H01R 33/0836; H01R 33/46; H01R 33/22; H01R 13/518; H02G 3/20; G02B 7/02;
(Continued)

(56) References Cited

U.S. PATENT DOCUMENTS 5,555,334 A * 9/1996 Ohnishi ............... G02B 6/4246
385/33
6,120,191 A * 9/2000 Asakura ............... G02B 5/1876
385/33
(Continued)

FOREIGN PATENT DOCUMENTS

JP  2008-107405 A  5/2008
JP  2008-258438 A  10/2008
(Continued)

*Primary Examiner* — Thanh Tam Le

(74) *Attorney, Agent, or Firm* — Global IP Counselors, LLP

(57) ABSTRACT

A light emitting device includes a base member, a laser element, a retaining member, a fluorescent member, and first and second fixing members. The retaining member has a first surface on a laser element side and a second surface not on the laser element side. The fluorescent member is fixed to a through hole of the retaining member. The first and second fixing members clamp the retaining member. The first and second fixing members have first and second contact surfaces in contact with the first and second surfaces of the retaining member, respectively. A distance between the first and second contact surfaces becomes smaller as the first and second contact surfaces become farther from the through hole. The retaining member, the first and second fixing members are arranged such that a space surrounded by the retaining member, and the first and second fixing members exists around the retaining member.

6 Claims, 5 Drawing Sheets

(51) Int. Cl.
    *H01S 3/05*     (2006.01)
    *H01S 5/00*     (2006.01)
    *H01S 5/022*    (2006.01)
    *H01S 5/323*    (2006.01)
(52) U.S. Cl.
    CPC ...... *H01S 5/02296* (2013.01); *H01S 5/02212* (2013.01); *H01S 5/32341* (2013.01)
(58) Field of Classification Search
    CPC ........ G02B 27/20; G02B 6/0006; B60R 1/06; F21V 2101/02; F21V 9/08; B60Q 1/0011
    USPC ........ 439/240, 334, 336, 340, 534; 359/819, 359/871; 362/84, 259, 455, 553, 581
    See application file for complete search history.

(56)         References Cited

U.S. PATENT DOCUMENTS

| | | | | |
|---|---|---|---|---|
| 6,742,938 | B2* | 6/2004 | Tanaka | G02B 6/4204 385/89 |
| 7,462,983 | B2* | 12/2008 | Baroky | C09K 11/574 257/100 |
| 8,106,414 | B2* | 1/2012 | Sugiyama | H01L 33/483 257/100 |
| 8,212,467 | B2* | 7/2012 | Sawamura | H01L 33/483 313/498 |
| 8,493,677 | B2* | 7/2013 | Imai | G02B 7/022 359/811 |
| 8,872,203 | B2* | 10/2014 | Nagahama | H01L 33/483 257/98 |
| 9,316,372 | B2* | 4/2016 | Harada | F21S 48/1145 |
| 2008/0075406 | A1 | 3/2008 | Kadomi et al. | |
| 2016/0186936 | A1* | 6/2016 | Kiyota | H01S 5/02296 362/84 |

FOREIGN PATENT DOCUMENTS

| | | |
|---|---|---|
| JP | 2008-262952 A | 10/2008 |
| JP | 2010-165834 A | 7/2010 |
| JP | 2016-122692 A | 7/2016 |

* cited by examiner

LIGHT EMITTING DEVICE

CROSS-REFERENCE TO RELATED APPLICATION

The present application claims priority to Japanese Patent Application No. 2016-126586, filed on Jun. 27, 2016, the disclosure of which is hereby incorporated by reference in its entirety.

BACKGROUND

The present invention relates to a light emitting device. There has been known a light emitting device which is formed by a combination of a semiconductor laser element and a wavelength conversion member. In Japanese Patent Application Laid-open No. 2008-262952, in order to prevent a wavelength conversion member disposed above a semiconductor laser element from coming off, the wavelength conversion member is fixed as being held down by an engaging member.

SUMMARY

However, with the conventional light emitting device, the fixing may become difficult when the dimension of the wavelength conversion member or that of the engaging member deviates from the design value. Further, since the engaging member directly holds down the wavelength conversion member, part of light from the wavelength conversion member may be absorbed by the engaging member and others, reducing the light emission intensity of the light emitting device.

The present disclosure includes the following inventive aspect. A light emitting device includes a base member, a laser element mounted on or above the base member, a retaining member, a fluorescent member, and a first fixing member and a second fixing member. The retaining member has a light reflective inner wall defining a through hole. The retaining member has a first surface on a laser element side and a second surface not on the laser element side. The fluorescent member is fixed to the through hole and disposed on an optical path of laser light emitted by the laser element. The first fixing member and the second fixing member clamp the retaining member. The first fixing member has a first contact surface in contact with the first surface of the retaining member. The second fixing member having a second contact surface in contact with the second surface of the retaining member. The first contact surface and the second contact surface are disposed in such a manner that a distance between the first contact surface and the second contact surface becomes smaller as the first contact surface and the second contact surface become farther from the through hole. The retaining member, the first fixing member and the second fixing member are arranged in such a manner that a space surrounded by the retaining member, the first fixing member, and the second fixing member exists around the retaining member.

Thus, the light emitting device capable of preventing a reduction in light emission intensity and exhibiting excellent productivity on a larger scale can be provided.

DETAILED DESCRIPTION

Figure 1:
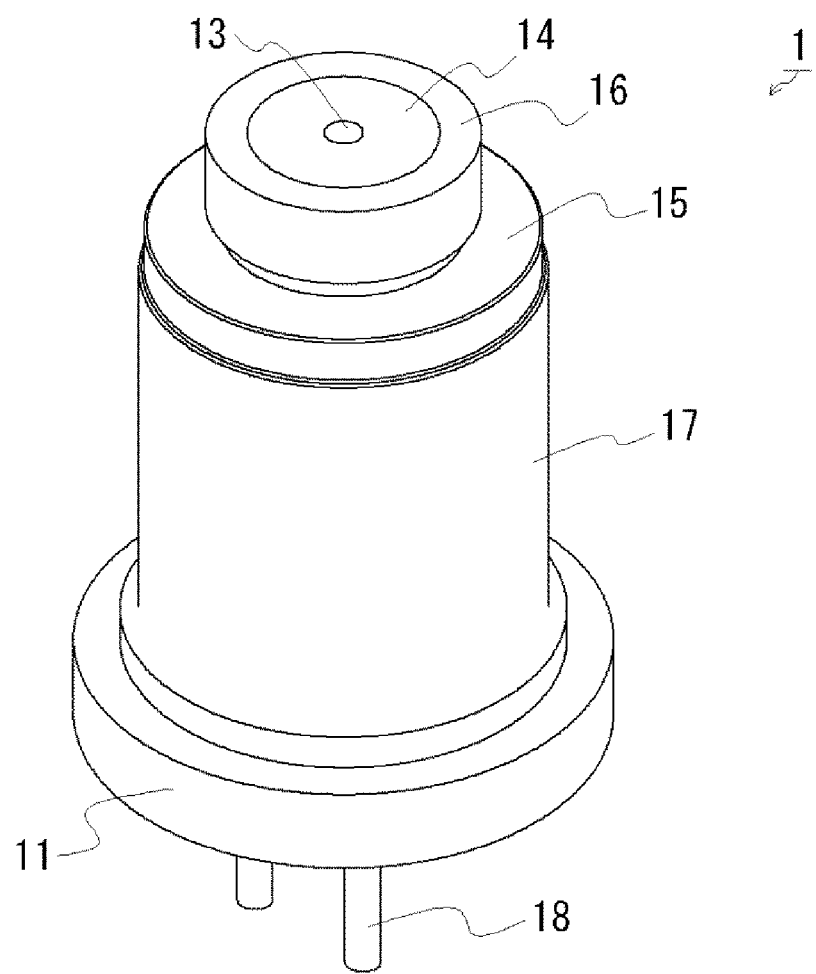
FIG. 1 is a schematic perspective view of a light emitting device according to an embodiment.

In the following, a description will be given of an embodiment of the invention with reference to the drawings as appropriate. Note that, a light emitting device described in the following is an embodiment of the technical idea of the present invention. Unless otherwise specified, the present invention is not specified to the following embodiment. The dimension, positional relationship and the like of members shown in the drawings may be exaggerated for the sake of clarity.

Figure 2:
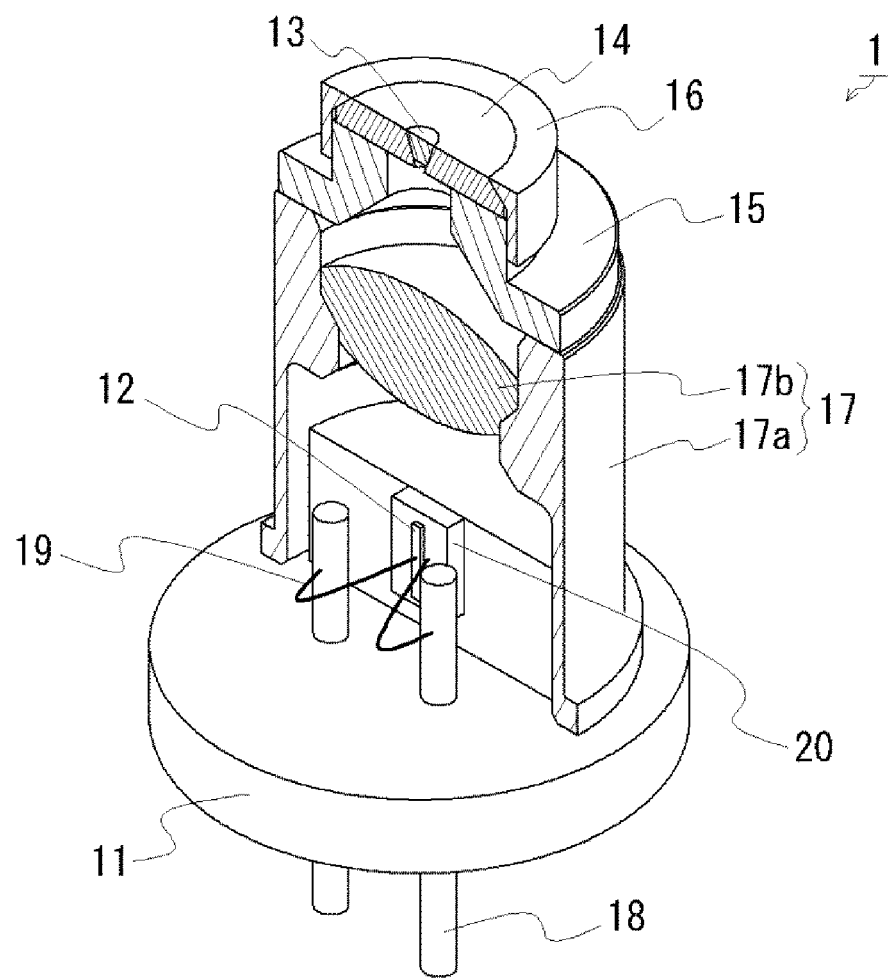
FIG. 2 is a schematic perspective view showing the light emitting device shown in FIG. 1 in which part of members is cut away.

FIGS. 1 and 2 are each a schematic perspective view showing a light emitting device 1 according to an embodiment. In FIG. 2, in order to facilitate understanding of the internal structure of the light emitting device 1, part of members is cut away. As shown in FIGS. 1 and 2, the light emitting device 1 includes a base member 11, a laser element 12, a fluorescent member 13, a retaining member 14, a first fixing member 15, and a second fixing member 16. The laser element 12 is mounted on or above the base member 11. The fluorescent member 13 is disposed on the optical path of laser light emitted by the laser element 12.

Figure 3A:
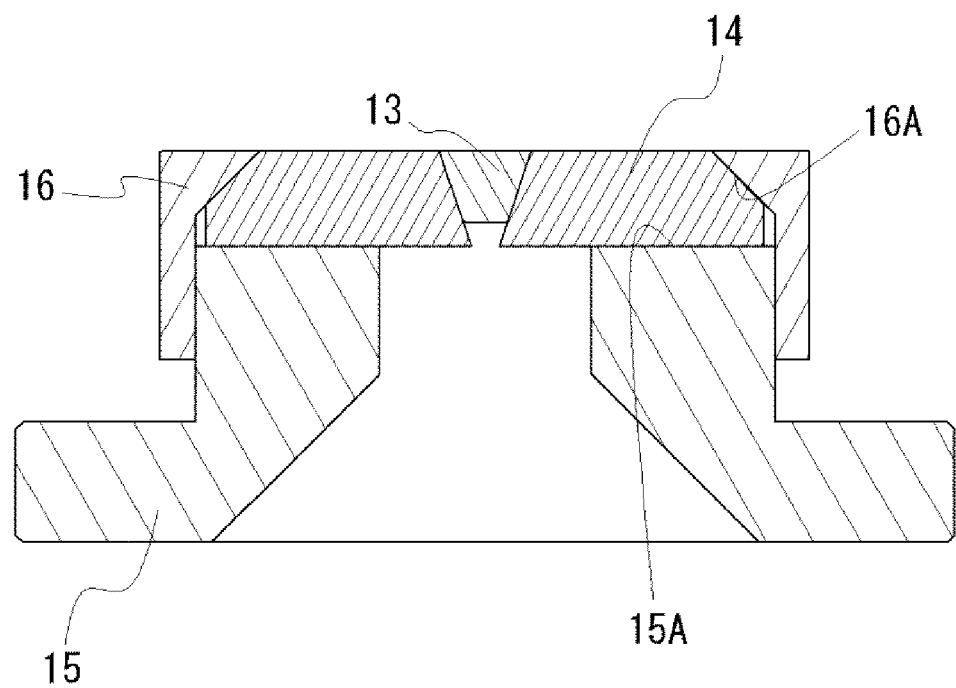
FIG. 3A is a schematic cross-sectional view of a first fixing member, a second fixing member, a retaining member, and a fluorescent member in the light emitting device shown in FIG. 1.
Figure 3B:
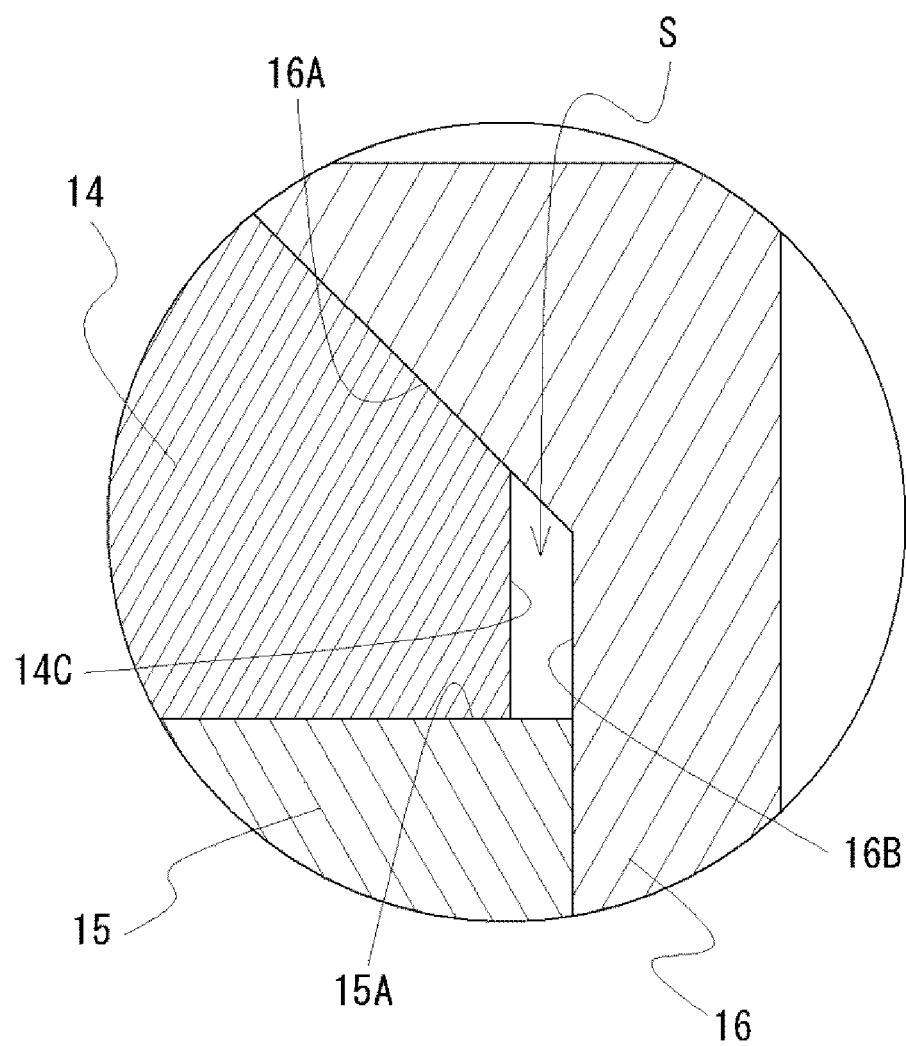
FIG. 3B is a partial enlarged view shown in FIG. 3A.
Figure 3C:
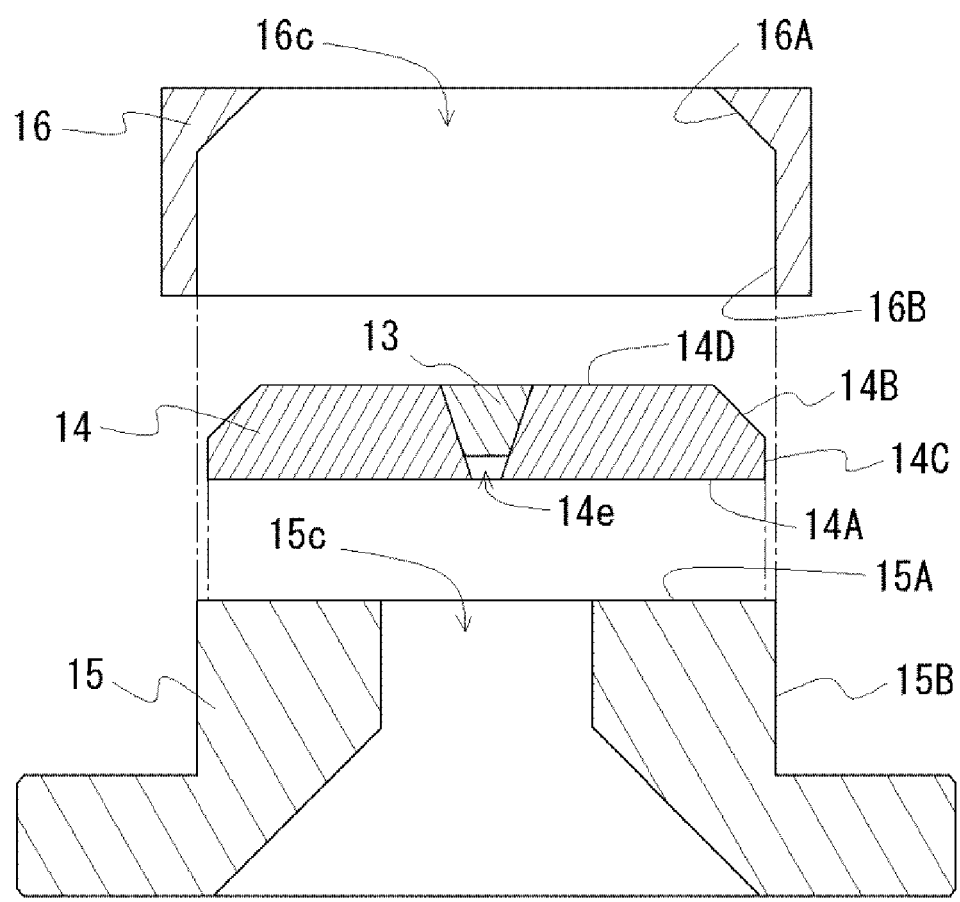
FIG. 3C is a schematic exploded cross-sectional view showing the first fixing member, the second fixing member, the retaining member, and the fluorescent member in the light emitting device shown in FIG. 1.

FIGS. 3A to 3C are each a schematic cross-sectional view showing the first fixing member 15, the second fixing member 16, the retaining member 14, and the fluorescent member 13. FIG. 3B is a partial enlarged view of FIG. 3A. FIG. 3C is an exploded view of FIG. 3A. As shown in FIGS. 3A to 3C, the retaining member 14 is provided with a through hole 14e that has a light-reflective inner wall. The fluorescent member 13 is fixed to the through hole 14e. The first fixing member 15 and the second fixing member 16 clamp the retaining member 14. The first fixing member 15 has a first contact surface 15A that is in contact with a first surface 14A, which is the surface of the retaining member 14 on the laser element 12 side. The second fixing member 16 has a second contact surface 16A that is in contact with a second surface 14B, which is the surface of the retaining member 14 on the side opposite to the first surface 14A. The first contact surface 15A and the second contact surface 16A are disposed in such a manner that the distance between them becomes smaller as the first contact surface 15A and the second contact surface 16A become farther from the through hole 14e. Note that, the distance between the first contact surface 15A and the second contact surface 16A refers to the length in the direction perpendicular to the first contact surface 15A (the top-bottom direction in FIGS. 3A to 3C). Further, as shown in FIG. 3B, around the retaining member 14, a space S surrounded by the retaining member 14, the first fixing member 15, and the second fixing member 16 exists.

In the light emitting device 1, the fluorescent member 13 is fixed to the through hole 14e of the retaining member 14, and not the fluorescent member 13 but the retaining member 14 is clamped by the first fixing member 15 and the second fixing member 16. Hence, light from the fluorescent member 13 will not be absorbed by the first fixing member 15 and the second fixing member 16. Further, since the space S is at a distant position from the fluorescent member 13, light from the fluorescent member 13 will not be contained in the space S. By virtue of these factors, with the light emitting device 1, light from the fluorescent member 13 can be efficiently extracted to the outside.

Further, since it is difficult to completely eliminate the dimensional deviation of members, during manufacture, for example, the width of the retaining member 14 (the length in the right-left direction in FIG. 3A) may become greater than the design value. With the light emitting device 1, in such a case also, the first fixing member 15 and the second fixing member 16 are spaced apart from the lateral surface of the retaining member 14 just enough to avoid contact with the lateral surface of the retaining member 14. That is, the structure in which the space S exists around the retaining member 14 is provided. This structure allows the first fixing member 15 and the second fixing member 16 to clamp the retaining member 14 despite any dimensional deviation from the design value of width of the retaining member 14 or the like.

Note that, while it may be concerned that the space S may cause positional displacement of the retaining member 14 (displacement in the right-left direction in FIG. 3A), provision of the first contact surface 15A and the second contact surface 16A suppresses such positional displacement. The first contact surface 15A of the first fixing member 15 and the second contact surface 16A of the second fixing member 16 are formed in such a manner that the distance between them becomes smaller as the first contact surface 15A and the second contact surface 16A become farther from the through hole 14e. Thus, despite any deviation from the design value of the dimension of the retaining member 14 or the like, the first contact surface 15A and the second contact surface 16A are capable of being brought into contact with the retaining member 14 at respective positions corresponding to the actual dimensions of the members, and restricting the retaining member 14 from shifting in the width direction. In this manner, by virtue of the retaining member 14 being less prone to suffer from positional displacement, that is, by virtue of the fluorescent member 13 being less prone to deviate from the optical path of laser light emitted by the laser element 12, the fluorescent member 13 can be surely irradiated with the laser light.

That is, providing the space S and forming the first contact surface 15A and the second contact surface 16A in such a manner that the distance between them becomes smaller as the first contact surface 15A and the second contact surface 16A become farther from the through hole 14e can provide the light emitting device that exhibits excellent productivity on a larger scale.

First Fixing Member 15

The first fixing member 15 clamps, in cooperation with the second fixing member 16, the retaining member 14. As shown in FIGS. 1 and 2, the first fixing member 15 is disposed on the laser element 12 side with reference to the retaining member 14.

The first fixing member 15 is disposed so as not to block laser light emitted by the laser element 12. That is, the first fixing member 15 is disposed so as not to close the through hole 14e of the retaining member 14. The first fixing member 15 is, for example, tubular. The first fixing member 15 may be provided with a through hole 15c which is greater in width than the through hole 14e. Such a through hole 15c is coupled to the through hole 14e. In this case, laser light transmits through the through hole 15c so that the fluorescent member 13 is irradiated with the laser light. As shown in FIG. 3C, the through hole 15c may have an inclined part of which width becomes smaller from the opening on the laser element 12 side toward other opening. Thus, provided that light from the laser element 12 condensed by a lens (a light-transmissive part 17b, which will be described later) is scattered by the fluorescent member 13, the scattered light can be reflected again toward the emission side (the top side in FIG. 3A).

The first fixing member 15 has the first contact surface 15A being in contact with the retaining member 14. The contact area between the first contact surface 15A and the first surface 14A is preferably 20% as great as or greater than the area of the first surface 14A. This structure can disperse the load applied on the retaining member 14 by the clamping of the first fixing member 15 and the second fixing member 16, and therefore the retaining member 14 is less prone to be damaged, e.g., cracked. Further, the contact area between the first contact surface 15A and the first surface 14A is, for example, 95% as great as or smaller than the area of the first surface 14A. As seen in a plan view, the first contact surface 15A preferably has a frame shape such as a substantially circular frame shape. With such a structure, the retaining member 14 can be stably fixed. Note that, a plan view is identical to a top view when the light extraction direction of the light emitting device 1 is the top side.

The first fixing member 15 may further include an outer lateral surface 15B. The outer lateral surface 15B is non-parallel to the first contact surface 15A, and for example, is substantially perpendicular to the first contact surface 15A. As shown in FIG. 3C, the outer lateral surface 15B being flat in shape may be disposed continuously from the first contact surface 15A being flat in shape. In the light emitting device 1, the first contact surface 15A is the uppermost surface out of the surfaces of the first fixing member 15. Accordingly, as shown in FIG. 3A, the first fixing member 15 is not disposed on the lateral side of the retaining member 14, and just the second fixing member 16 is disposed on the lateral side of the retaining member 14.

As shown in FIGS. 2 and 3A, the width of the first fixing member 15 may be narrower on the retaining member 14 side than on the laser element 12 side. This facilitates joining the surface of the first fixing member 15 on the laser element 12 to a cap 17, which will be described later. Further, the first fixing member 15 can be disposed in such a manner that the outer edge of the second fixing member 16 is not positioned outer than the outer edge of the first fixing member 15 as seen in a plan view. As seen in a plan view, the outer edge of the first fixing member 15 is for example positioned inner than the outer edge of the cap 17. The outer edge of the first fixing member 15 as seen in a plan view is, for example, circular.

The material of the first fixing member 15 is, for example, metal. As will be described later, the second fixing member 14 is preferably fixed to the first fixing member 15 by welding, and the first fixing member 15 is preferably made of a material that can be welded. By welding, the joining portion of the two members is continuously integrated. Such a material may be metal containing one type selected from the group consisting of Ni, Cu, Co, Al, and Fe. Among others, the first fixing member 15 is preferably made of a material of which main component is Fe. More preferably, the first fixing member 15 is made of stainless steel, KOVAR®, or Fe—Ni alloy.

Second Fixing Member 16

As shown in FIGS. 1 and 2, the second fixing member 16 is partially disposed on the light extraction side of the retaining member 14. The second fixing member 16 is disposed so as not to block light from the fluorescent member 13. That is, the second fixing member 16 is disposed so as not to close the through hole 14e of the retaining member 14. As seen in a plan view, the shortest distance from the fluorescent member 13 to the second fixing member 16 is, for example, 0.5 mm or greater. The second fixing member 16 is, for example, tubular. In this case, the second fixing member 16 is provided with a through hole 16c being greater in width than the through hole 14e, and the through hole 16c and the through hole 14e are coupled to each other. As shown in FIG. 3C, the through hole 16c may have an inclined part that becomes smaller in width from the lower opening on the laser element 12 side toward the upper other opening.

As shown in FIGS. 3A to 3C, the second fixing member 16 has the second contact surface 16A being in contact with the retaining member 14. As seen in a plan view, the second contact surface 16A preferably has a frame shape such as a substantially circular frame shape. With such a structure, the retaining member 14 can be stably fixed. The area of the second contact surface 16A is, for example, approximately 1 mm$^2$ to 13 mm$^2$. Further, in a cross-sectional view taken along the thickness direction of the retaining member 14 such as FIG. 3A, the length of the second contact surface 16A is, for example, approximately 0.1 mm to 1.5 mm. As shown in FIG. 3B, the second contact surface 16A partially extends outer than the retaining member 14 (in the direction becoming farther from the fluorescent member 13). This structure allows the second contact surface 16A to surely hold down the retaining member 14 despite any deviation from the design value of the dimension of the retaining member 14 or the like.

As shown in FIGS. 3A to 3C, the second fixing member 16 may have a fixed surface 16B that extends along the outer lateral surface 15B of the first fixing member 15 and fixed to the outer lateral surface 15B. Further, in this case, the surface of the second fixing member 16 other than the fixed surface 16B is preferably spaced apart from the first fixing member 15 and the base member 11. Thus, in fixing the second fixing member 16, the position of the second fixing member 16 can be adjusted in the direction along the outer lateral surface 15B (the top-bottom direction in FIG. 3C). Accordingly, despite any deviation from the design value of the dimension of the retaining member 14 and the like, adjusting the second fixing member 16 in the direction along the outer lateral surface 15B (the top-bottom direction in FIG. 3C) can surely fix the retaining member 14.

The second fixing member 16 is preferably welded to the first fixing member 15 at the fixed surface 16B. The welding can firmly fix the first fixing member 15 and the second fixing member 16 to each other. Further, the welding performed at such a position being distant from the fluorescent member 13 is also advantageous in avoiding any foreign object from attaching to the surface of the fluorescent member 13 due to gas generated by the welding. The fixed surface 16B is in contact with the outer lateral surface 15B by, for example, an area of approximately 3 mm$^2$ to 16 mm$^2$. Further, in a cross-sectional view taken along the thickness direction of the retaining member 14 such as FIG. 3A, the length of the fixed surface 16B is, for example, approximately 0.2 mm to 2.0 mm. The fixed surface 16B may be continuous from the second contact surface 16A. By the fixed surface 16B being positioned so as not to be in contact with the retaining member 14, the space S can be formed. The width of the space S is equal to the spaced-apart distance between the fixed surface 16B and the retaining member 14.

For example, the through hole 16c having circular openings is provided to the second fixing member 16, and the retaining member 14 is set to have a circular outer edge as seen in a plan view. In this case, in the inner wall of the through hole 16c, the region having an inner diameter which is greater than the outer diameter of the retaining member 14 is the fixed surface 16B. Further, in the inner wall of the through hole 16c, the region that is continuous from the fixed surface 16B and inclined to be tapered so that the minimum inner diameter becomes smaller than the outer diameter of the retaining member 14 is the second contact surface 16A. The outer edge of the second fixing member 16 as seen in a plan view is circular, for example.

The material of the second fixing member 16 is metal, for example. Similarly to the first fixing member 15, the second fixing member 16 is preferably made of a material that can be welded to the first fixing member 15. The material of the second fixing member 16 may be selected from the above-described group of the materials of the first fixing member 15.

Retaining Member 14

The retaining member 14 is clamped by the first fixing member 15 and the second fixing member 16, and provided with the through hole 14e where the fluorescent member 13 is fixed. The openings of the through hole 14e are, for example, each circular as seen in a top view. Since the laser light beam emitted by the laser element 12 is substantially elliptical, the through hole 14e suitably have a shape of a circular column, a frustum of a cone, or combination of the foregoing. The through hole 14e has a dimension with allows the laser light emitted by the laser element 12 to transmit through. For example, the through hole 14e may have a shape of a frustum of a cone of which diameter falls within a range of 0.1 mm to 6.5 mm. The through hole 14e preferably has a shape which spreads from the laser light entering side to the light extraction side, that is, from the lower side toward the upper side. Thus, light and the like of the fluorescent member 13 can be reflected by the inner wall of the through hole 14e to be extracted upward, thereby improving the light extraction efficiency. Note that, the lower side refers to the side where laser light emitted by the laser element 12 enters, and the upper side refers to the light extraction side of the light emitting device 1.

The inner wall of the through hole 14e is made of a light reflective material. For example, the retaining member 14 is entirely made of a light reflective material. Further, the through hole is provided to a portion of the retaining member 14 made of the main material, and a light reflective film being high in reflectivity than the main material may be provided to the inner wall of the through hole, so that the light reflective film serves as the inner wall of the through hole 14e. The light reflective film is, for example, a metal film. The inner wall of the through hole 14e preferably exhibits reflectivity of 60% or greater, more preferably 80% or greater, to light from the fluorescent member 13. The light from the fluorescent member 13 refers to at least one of fluorescence emitted by the fluorescent material contained in the fluorescent member 13 and excitation light therefor. Representatively, the light from the fluorescent member 13 refers to both the fluorescence and the excitation light.

As shown in FIG. 3C, the retaining member 14 has the first surface 14A and the second surface 14B. The first surface 14A and the second surface 14B are disposed in such a manner that the distance between them becomes greater as the first surface 14A and the second surface 14B become closer to the through hole 14e. Note that, the distance between the first surface 14A and the second surface 14B refers to the distance in the direction perpendicular to the first surface 14A (the top-bottom direction in FIG. 3C). In the case where the second surface 14B is parallel to the first surface 14A, the second surface 14B is in contact with the second contact surface 16A at the terminating end of the second surface 14B (the upper corner of the retaining member), which restricts the contact area between the second surface 14B and the second contact surface 16A. On the other hand, as shown in FIG. 3C, when the second surface 14B is the inclined surface which is similar to the second contact surface 16A, the contact area between the second surface 14B and the second contact surface 16A can increase. This can provide the light emitting device 1 including the retaining member 14 less prone to be damaged. For example, the inclining angle of the second surface 14B to the first surface 14A is substantially identical to the inclining angle of the second contact surface 16A to the first contact surface 15A.

The retaining member 14, the first fixing member 15, and the second fixing member 16 are disposed in such a manner that, as seen in a plan view, the outer edge of the retaining member 14 is positioned inner than both the outer edge of the first contact surface 15A and the outer edge of the second contact surface 16A. This implements the structure in which the space S exists around the retaining member 14. The space S preferably exists to entirely surround the retaining member 14. That is, the retaining member 14, the first fixing member 15, and the second fixing member 16 are preferably disposed in such a manner that the entire outer edge of the retaining member 14 is positioned inner than both the outer edge of the first contact surface 15A and the outer edge of the second contact surface 16A. This allows the light emitting device 1 to more surely tolerate any deviation from the design value of the dimension of the retaining member 14 or the like. The width of the space S, that is, the shortest spaced-apart distance between the retaining member 14 and the second fixing member 16 is preferably 0.02 mm or greater. This can improve tolerance to any deviation from the design value of the dimension of the retaining member 14 and the like, which can further improve yield. Further, the width of the space S may be 1.2 mm or smaller, which can suppress an increase in width of the light emitting device 1. Use of the first fixing member 15 and the second fixing member 16 makes it possible to fix the retaining member 14 without the necessity of using an adhesive agent. Accordingly, the space S is representatively filled with gas such as air.

As shown in FIG. 3C, the retaining member 14 may have the third surface 14C. The third surface 14C is non-parallel to the first surface 14A and the second surface 14B, and connects between the first surface 14A and the second surface 14B. In this case, as shown in FIG. 3B, around the retaining member 14, the space S surrounded by the third surface 14C, the first contact surface 15A, the fixed surface 16B, and the second contact surface 16A exists. The outer periphery of the retaining member 14 having the third surface 14C, i.e., being chamfered, is advantageous in that the outer periphery is less prone to be damaged.

Further, as shown in FIG. 3C, the retaining member 14 may have the fourth surface 14D. The fourth surface 14D connects between the light extraction side end of the through hole 14e and the second surface 14B. In the case where the through hole 14e and the second surface 14B are directly connected to each other, the width of the retaining member 14 on the lateral side of the through hole 14e becomes smaller toward the top. As compared to such a case, the retaining member 14 having the fourth surface 14D can have a greater width around the upper end of the through hole 14a. That is, the area of a certain wideness can be reliably obtained as the region clamped by the first fixing member 15 and the second fixing member 16. This can facilitate dissipation of heat from the fluorescent member 13 mainly to the first fixing member 15. The fourth surface 14D may not be in contact with the second fixing member 16, and the fourth surface 14D is, for example, substantially parallel to the first surface 14A. As seen in a plan view, at least the most part of the fourth surface 14D is exposed outside the second fixing member 16. The height of the uppermost surface of the second fixing member 16 and the height of the uppermost surface of the retaining member 14 are, for example, substantially identical to each other.

The material of the retaining member 14 may be ceramic, metal, or a composite of ceramic and metal, and is ceramic, for example. The ceramic is preferably aluminum oxide or aluminum nitride, which exhibit high thermal conductivity and reflectivity. The thickness of the retaining member 14 is preferably 0.2 mm or greater in view of strength, and preferably 2 mm or smaller in view of down-sizing of the light emitting device.

Fluorescent Member 13

The fluorescent member 13 contains a fluorescent material that emits fluorescence by excitation light. The excitation light is the light emitted by the laser element 12. The fluorescent member 13 may be formed by a light-transmissive base material and the fluorescent material dispersed therein. In order to suppress laser light from attracting dust, the light-transmissive base material is preferably an inorganic material. The inorganic material may be aluminum oxide, borosilicate glass, soda-lime glass, soda glass or the like. The fluorescent member 13 may be monocrystals of the material of the fluorescent material. A material that absorbs laser light from the laser element 12 and converts wavelength of the laser light to provide light of different wavelength is selected as the fluorescent material. For example, the fluorescent material may be cerium-activated yttrium-aluminum-garnet (YAG), cerium-activated lutetium-aluminum-garnet (LAG), europium and/or chromium-activated nitrogen-containing calcium aluminosilicate (CaO—$Al_2O_3$—$SiO_2$), europium-activated silicate ($(Sr,Ba)_2SiO_4$), α-sialon fluorescent material, β-sialon fluorescent material or the like. Among others, a YAG fluorescent material being heat-resistant is preferably employed.

The thickness of the fluorescent member 13 is, for example, approximately 0.01 mm to 1 mm, and is preferably approximately 0.05 mm to 0.8 mm. The fluorescent member 13 may be a layered structure of materials of the same or different composition. For example, a semiconductor laser element that emits blue-color laser light is employed as the laser element 12. A layered structure of a sintered body composed of a cerium-activated YAG fluorescent material and aluminum oxide, and glass containing a red-color emitting fluorescent material is employed as the fluorescent member 13. This structure can provide white-color light exhibiting excellent color rendering property. Preferably, the upper surface of the fluorescent member 13 is positioned at a substantially identical level as the upper surface of the retaining member 14, or positioned lower than the upper surface of the retaining member 14. This prevents light from the fluorescent member 13 from laterally spreading, and hence can provide the light emitting device 1 exhibiting higher luminance.

Laser Element 12

The laser element 12 emits laser light. The laser element 12 has a semiconductor layered body which includes, in sequence, an n-side semiconductor layer, an active layer, and a p-side semiconductor layer. The laser element 12 emits laser light that has the peak wavelength in a range of, for example, 300 nm to 600 nm, and preferably 400 nm to 470 nm. The laser element 12 that emits blue-color laser light may include a nitride semiconductor layered body such as GaN.

Base Member 11

The base member 11 is used for mounting the laser element 12 at a proper position. In the base member 11, at least the portion being in contact with the cap 17, which will be described later, is preferably made of metal. This allows the base member 11 and the cap 17 to be fixed to each other by welding, whereby the base member 11 and the cap 17 can surely be fixed to each other. The base member 11 is made of, for example, metal. The base member 11 may be structured to contain at least one type selected from the group consisting of Ni, Cu, Co, Al, and Fe. Among others, the base member 11 is preferably made of a material of which main component is Fe, such as stainless steel, KOVAR®, or Fe—Ni alloy.

The base member 11 is, for example, substantially circular as seen in a plan view. As shown in FIG. 2, the base member 11 may have a projection that project toward the upper side, which is the light extraction side. The laser element 12 can be mounted directly, or via a submount 20, on the lateral surface of the projection. The laser element 12 being mounted on or above the base member 11 includes the above-described mounting via the submount 20. The submount 20 may be made of aluminum nitride or silicon carbide. The laser element 12 is electrically connected to lead terminals 18 via wires 19, for example. The lead terminals 18 penetrate through the base member 11 in the top-bottom direction, and the portions projecting from the lower surface of the base member 11 are electrically connected to an external power supply.

Cap 17

The light emitting device 1 preferably further includes the cap 17 that is fixed to the base member 11 so as to hermetically seal the laser element 12. This structure can reduce attraction of dust due to laser light emitted by the laser element 12, in the hermetically sealed space around the laser element 12. Since a gap tends to be formed between the first fixing member 15 and the retaining member 14, and between the retaining member 14 and the fluorescent member 13, preferably an hermetically sealed space is formed with the cap 17 and the base member 11, and the first fixing member 15 and others are mounted thereon. Dust attraction tends to occur when laser light emitted by the laser element 12 has the oscillation peak wavelength in a relatively short wavelength range of approximately 300 nm to 600 nm. For example, dust tends to be attracted with the laser element 12 that emits blue-color laser light, and hence preferably the laser element 12 is hermetically sealed using the cap 17.

The base member 11 and the cap 17 are fixed to each other by, for example, welding. In this case, in each of the base member 11 and the cap 17, at least the portion being welded is made of a metal material that can be welded. The metal material that can be welded is as described above. The cap 17 may be made up of a body part 17a and a light-transmissive part 17b. The body part 17a is, for example, a tubular or lid-like member made of a metal material. The lower surface of the body part 17a is fixed to the base member 11 by welding or the like, and the body part 17a is provided with a through hole at the upper portion. The light-transmissive part 17b is fixed to the through hole. The light-transmissive part 17b is disposed on the optical path of the laser light emitted by the laser element 12, and allows the laser light to transmit through. The light-transmissive part 17b is a transparent element containing no fluorescent material, such as a lens.

As shown in FIG. 2, with the light emitting device 1, the first fixing member 15 is fixed to the upper surface of the cap 17 so as not to extend outside the upper surface of the cap 17. This structure can provide the light emitting device 1 with the handleability in mounting the light emitting device 1 on a module or the like, which handleability is substantially equivalent to that of a light emitting device not including the first fixing member 15 and the second fixing member 16. That is, with a light emitting device not including the first fixing member 15 and the second fixing member 16, a positioning part for determining the orientation of the light emitting device is provided to the base member, whereby the orientation of the light emitting device is determined. The positioning part is, for example, a partially inwardly recessed portion at the outer edge of the base member as seen in a plan view. Provided that the first fixing member 15 or the second fixing member 16 is greater than the cap 17 as seen in a plan view, the positioning part of the base member 11 is covered with the first fixing member 15 or the second fixing member 16, making it difficult to determine the orientation of the light emitting device 1. Accordingly, as shown in FIG. 2, with the light emitting device 1, the first fixing member 15 is welded to the surface of the cap 17. Thus, the orientation of the light emitting device 1 can be determined using the positioning part of the base member 11.

What is claimed is:
1. A light emitting device comprising:
a base member;
a laser element mounted on or above the base member;
a retaining member having a light reflective inner wall defining a through hole, the retaining member having a first surface on a laser element side and a second surface not on the laser element side;
a fluorescent member fixed to the through hole and disposed on an optical path of laser light emitted by the laser element; and
a first fixing member and a second fixing member clamping the retaining member, the first fixing member having a first contact surface in contact with the first surface of the retaining member, the second fixing member having a second contact surface in contact with the second surface of the retaining member, the first contact surface and the second contact surface being disposed in such a manner that a distance between the first contact surface and the second contact surface becomes smaller as the first contact surface and the second contact surface become farther from the through hole,
wherein the retaining member, the first fixing member and the second fixing member are arranged in such a manner that a space surrounded by the retaining member, the first fixing member, and the second fixing member exists around the retaining member.

2. The light emitting device according to claim 1, wherein the first fixing member has an outer lateral surface, and the second fixing member has a fixed surface fixed to the outer lateral surface, and a surface other than the fixed surface spaced apart from the first fixing member and the base member.

3. The light emitting device according to claim 2, wherein the second fixing member is welded to the first fixing member at the fixed surface.

4. The light emitting device according to claim 1, wherein the first surface and the second surface of the retaining member are provided in such a manner that a distance between the first surface and the second surface becomes greater as the first surface and the second surface become closer to the through hole.

5. The light emitting device according to claim 1, wherein the retaining member includes a third surface connecting between the first surface and the second surface with the third surface being non-parallel to the first surface and the second surface, and the space is surrounded by the third surface of the retaining member, the first fixing member, and the second fixing member.

6. The light emitting device according to claim 1, further comprising a cap fixed to the base member and hermetically sealing the laser element, wherein the first fixing member is joined to the cap.

* * * * *